(12) United States Patent
Yu et al.

(10) Patent No.: US 11,646,331 B2
(45) Date of Patent: May 9, 2023

(54) PACKAGE SUBSTRATE

(71) Applicant: PHOENIX PIONEER TECHNOLOGY CO., LTD., Hsinchu County (TW)

(72) Inventors: Chun-Hsien Yu, Hsinchu County (TW); Hsien-Ming Tsai, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 5 days.

(21) Appl. No.: 16/885,069

(22) Filed: May 27, 2020

(65) Prior Publication Data
US 2020/0388640 A1     Dec. 10, 2020

(30) Foreign Application Priority Data
Jun. 4, 2019   (TW) ................................ 108119267

(51) Int. Cl.
*H01L 27/146* (2006.01)

(52) U.S. Cl.
CPC .. *H01L 27/14618* (2013.01); *H01L 27/14636* (2013.01)

(58) Field of Classification Search
CPC ......... H01L 27/14618; H01L 27/14636; H01L 2224/48091; H01L 23/49838; H01L 23/49822
See application file for complete search history.

(56) References Cited

U.S. PATENT DOCUMENTS

| | | | | |
|---|---|---|---|---|
| 9,241,097 | B1* | 1/2016 | Tam ..................... | H04N 5/2254 |
| 9,301,407 | B2* | 3/2016 | Miyazaki ............. | H05K 3/4697 |
| 2015/0373854 | A1* | 12/2015 | Ikemoto ................ | H04N 5/225 361/767 |
| 2016/0268326 | A1* | 9/2016 | Yu ...................... | H01L 27/14618 |
| 2016/0293537 | A1* | 10/2016 | Sugiyama ......... | H01L 23/49822 |
| 2017/0019993 | A1* | 1/2017 | Tsai .................... | H05K 3/4682 |
| 2018/0130750 | A1* | 5/2018 | Jung .................... | H04N 5/2253 |

* cited by examiner

*Primary Examiner* — Jonathan Han
(74) *Attorney, Agent, or Firm* — WPAT, P.C

(57) ABSTRACT

This disclosure provides a package substrate including: a first dielectric layer formed of a first molding compound; a first conductive wire and a first conductive channel disposed in the first dielectric layer; a second dielectric layer formed of a second molding compound; a second conductive wire and a second conductive channel disposed in the second dielectric layer; a third dielectric layer formed of a third molding compound; a third conductive wire and a third conductive channel disposed in the third dielectric layer; a fourth dielectric layer formed of a fourth molding compound; a fourth conductive wire, a fourth conductive channel and a circuit device disposed in the fourth dielectric layer; wherein, a first empty region, a second empty region, a third empty region and a fourth empty region are formed in the first, second, third and fourth dielectric layers, respectively, and the empty regions are vertically overlapped.

11 Claims, 9 Drawing Sheets

_US 11,646,331 B2_

PACKAGE SUBSTRATE

CROSS REFERENCE TO RELATED APPLICATION

The application is based on, and claims priority from, Taiwan Application Serial Number 108119267, filed on Jun. 4, 2019, the disclosure of which is hereby incorporated by reference herein in its entirety.

TECHNICAL FIELD

The invention relates to a package substrate, in particular to a package substrate suitable for making an image sensing module.

BACKGROUND

The new generation of electronic products is constantly developing towards light, thin, short and high density, which makes the integrated circuit chip technology and its back-end packaging technology progress. The performance requirements of the resolution, miniaturization, and multiple lens operation of the image sensor module of digital cameras or camcorders equipped with various mobile devices are also becoming strict. Therefore, the assembly of the image sensing module and the packaging of the image processing chip must consider the flatness, heat dissipation, thinness, wiring density and reliability of the package substrate, with a view to applying it to optical sensing, stereo imaging, mobile devices, and automotive electronic products.

At present, most of the package substrates used for image sensing modules use ceramic substrates or rigid-flex boards. The former has disadvantages such as being expensive, being unable to make thin lines, and being difficult to thin. The latter has disadvantages such as poor heat dissipation, difficulty in thinning using wire bonding technology, poor alignment accuracy between the flexible and hard layers of the flexible-hard board, and poor bonding. As shown in FIG. 1, it is a conventional camera lens module that combines ceramic substrate and rigid-flex board. The conventional camera lens module includes a heat sink 311, a flexible board connector 381, an image sensing device 321, a multilayer ceramic substrate circuit 371, a filter glass sheet 331, a circuit device 391, a support holder 361, a voice coil motor 351, and a lens group 341. The multilayer ceramic substrate circuit 371 is a multilayer circuit substrate in which each layer of the ceramic substrate and its circuits are separately sintered and then stacked into a bulk structure. Therefore, it has the following disadvantages. Ceramic substrates are expensive. Conductive circuits are printed with silver paste and plugged, making it impossible to make fine circuits. The thickness of the single-layer ceramic substrate has a certain thickness, resulting in that the overall module height cannot be reduced. The circuit element 391 cannot be embedded in a ceramic substrate. The surface components need to be bonded to the flexible board connector 381 using the complex and easily de-solderable surface bonding technology. Moreover, as shown in FIG. 2, it is a conventional camera lens module using rigid-flex board technology. The conventional camera lens module includes a rigid-flex board 372, an image sensing device 322, a multilayer ceramic substrate circuit 371, a filter glass sheet 332, a circuit device 392, a support holder 362, a voice coil motor 352, and a lens group 342. The rigid-flex board 372 is a staggered stack of rigid substrates 372_a_, 372_c_ and flexible substrate 372_b_. It has the following disadvantages. The rigid-flex board 372 has poor heat dissipation. Partial molding of the image sensing device 322 requires an additional mold. The Image sensing device 322 increases package height due to wire bonding. The difference between the materials of the flexible board and the rigid board of the rigid-flex board 372 will cause the inter-layer alignment accuracy to exceed 100 microns and affect the wiring density. Therefore, it is necessary to develop new package substrate technology to solve and improve the above problems.

SUMMARY

One embodiment of the present invention provides a package substrate including a first dielectric layer, formed of a first molding compound, and the first dielectric layer having a first empty region penetrating the first dielectric layer; a first conductive wire and a first conductive channel, disposed in the first dielectric layer, wherein the first conductive channel is disposed on the first conductive wire, and one end surface of the first conductive channel is exposed on the first dielectric layer; a second dielectric layer, disposed on the first dielectric layer, formed of a second molding compound, and the second dielectric layer having a second empty region corresponding to the first empty region and penetrating the second dielectric layer; a second conductive wire and a second conductive channel, disposed in the second dielectric layer, wherein the second conductive wire is electrically connected to the first conductive channel, the second conductive channel is disposed on the second conductive wire, and one end surface of the second conductive channel is exposed on the second dielectric layer; a third dielectric layer, disposed on the second dielectric layer, formed of a third molding compound, and the third dielectric layer having a third empty region corresponding to the second empty region and penetrating the third dielectric layer; a third conductive wire and a third conductive channel, disposed in the third dielectric layer, wherein the third conductive wire is electrically connected to the second conductive channel, the third conductive channel is disposed on the third conductive wire, and one end surface of the third conductive channel is exposed on the third dielectric layer; a fourth dielectric layer, disposed on the third dielectric layer, formed of a fourth molding compound, and the fourth dielectric layer having a fourth empty region corresponding to the third empty region and penetrating the fourth dielectric layer; and a fourth conductive wire, a fourth conductive channel and a circuit device, disposed in the fourth dielectric layer, wherein the fourth conductive wire is electrically connected to the third conductive channel, the fourth conductive channel and the circuit device are disposed on the fourth conductive wire, and one end surface of the fourth conductive channel is exposed on the fourth dielectric layer.

In a preferred embodiment, the third empty region and the fourth empty region are used to accommodate an image sensing device.

In a preferred embodiment, the package substrate further comprises a flexible circuit board disposed on the image sensing device and the fourth dielectric layer, and the flexible circuit board electrically connected to the one end surface of the fourth conductive channel exposed on the fourth dielectric layer.

Another embodiment of the present invention provides a package substrate including a carrier board, having a central empty region penetrating the carrier board and a disconnecting region cutting off the carrier board; a first dielectric layer, a second dielectric layer, a third dielectric layer and a fourth dielectric layer, formed of a first molding compound, a second molding compound, a third molding compound, and a fourth molding compound, respectively, wherein the first dielectric layer is disposed on the carrier board, the second dielectric layer is disposed on the first dielectric layer, the third dielectric layer is disposed on the second dielectric layer, and the fourth dielectric layer is disposed on the third dielectric layer; wherein the first dielectric layer, the second dielectric layer, and the third dielectric layer are flexible molding compounds, and the fourth dielectric layer are hard molding compounds; wherein the first dielectric layer, the second dielectric layer, and the third dielectric layer are flexible with respect to the disconnecting region of the carrier board; wherein the first dielectric layer, the second dielectric layer, the third dielectric layer, and the fourth dielectric layer correspond to the central of the carrier board, and a first empty region, a second empty region, a third empty region and a fourth empty region are respectively correspondingly provided; wherein a portion of the fourth dielectric layer corresponding to the disconnecting region of the carrier board is provided with a disconnection groove cutting off the fourth dielectric layer; a first conductive wire and a first conductive channel, disposed in the first dielectric layer, wherein the first conductive channel is disposed on the first conductive wire, and one end surface of the first conductive channel is exposed on the first dielectric layer; a second conductive wire and a second conductive channel, disposed in the second dielectric layer, wherein the second conductive wire is electrically connected to the first conductive channel, the second conductive channel is disposed on the second conductive wire, and one end surface of the second conductive channel is exposed on the second dielectric layer; a third conductive wire and a third conductive channel, disposed in the third dielectric layer, wherein the third conductive wire is electrically connected to the second conductive channel, the third conductive channel is disposed on the third conductive wire, and one end surface of the third conductive channel is exposed on the third dielectric layer; and a fourth conductive wire, a fourth conductive channel and a circuit device, disposed in the fourth dielectric layer, wherein the fourth conductive wire is electrically connected to the third conductive channel, the fourth conductive channel and the circuit device are disposed on the fourth conductive wire, and one end surface of the fourth conductive channel is exposed on the fourth dielectric layer.

In a preferred embodiment, the third empty region and the fourth empty region are used to accommodate an image sensing device.

In a preferred embodiment, the first molding compound, the second molding compound, the third molding compound, and the fourth molding compound are epoxy molding compounds.

DETAILED DESCRIPTION

Figure 1:
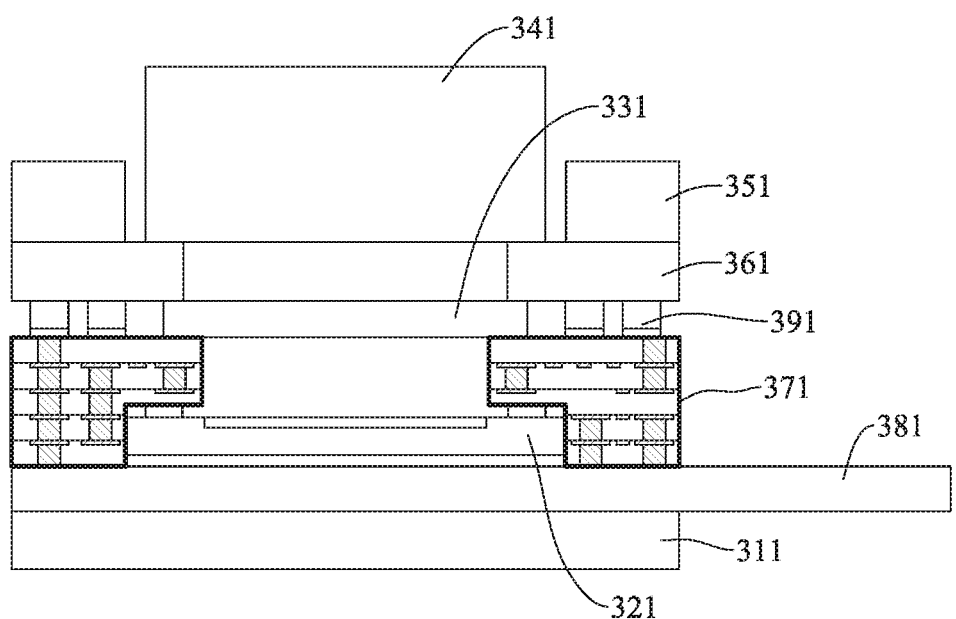
FIG. 1 is a cross-sectional view of a conventional camera lens that combines ceramic substrate and rigid-flex board.
Figure 2:
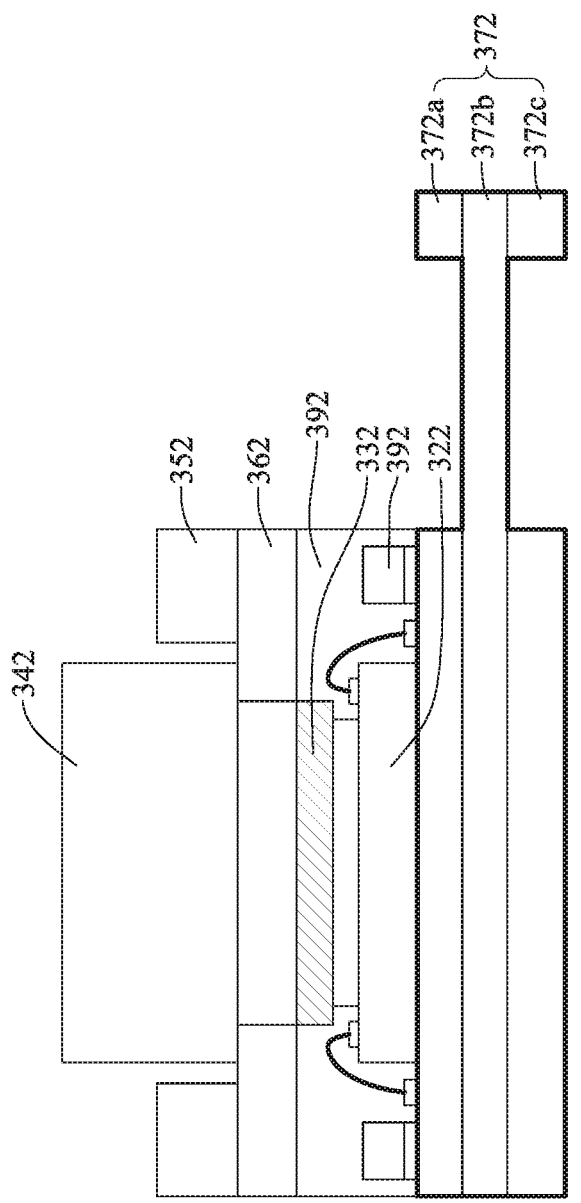
FIG. 2 is a cross-sectional view of a conventional camera lens module using a rigid-flex board technology.

In order to further understand and understand the features, objectives, and functions of the present invention, the embodiments of the present invention are described in detail with reference to the drawings. Throughout the description and drawings, the same component numbers will be used to designate the same or similar components.

In the description of each embodiment, when an element is described as "above" or "below" another element, it refers to a situation where it is directly or indirectly above or below the other element, which may contain other elements set in between. The so-called "directly" means that there are no other intermediary elements in between. Descriptions such as "above" or "below" are described based on the drawings, but also include other possible direction changes. The so-called "first", "second", and "third" are used to describe different elements, and these elements are not restricted by such predicates. For the convenience and clarity of illustration, the thickness or size of each element in the drawings is shown in an exaggerated, omitted, or sketched manner, and the size of each element is not exactly its actual size.

Figure 3:
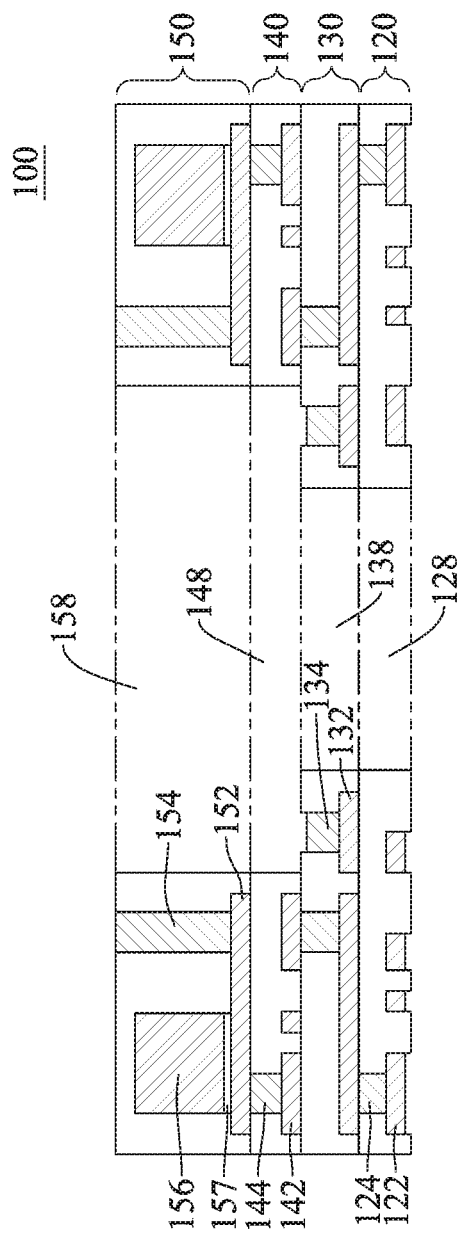
FIG. 3 is a cross-sectional view of a package substrate according to a first embodiment.

FIG. 3 is a cross-sectional view of a package substrate 100 according to a first embodiment of the present invention. The package substrate 100 includes a first dielectric layer 120, a second dielectric layer 130, a third dielectric layer 140, and a fourth dielectric layer 150, which are sequentially stacked from bottom to top. A material of the first dielectric layer 120 is a first molding compound, and a first conductive wire 122 and a first conductive channel 124 are disposed in the first dielectric layer 120. The first conductive channel 124 is disposed on the first conductive wire 122, and an upper end surface of the first conductive channel 124 is not covered by the first dielectric layer 120. A material of the second dielectric layer 130 is a second molding compound, and a second conductive wire 132 and a second conductive channel 134 are disposed in the second dielectric layer 130. The second conductive wire 132 is disposed on an upper end surface of the first conductive channel 124, and the second conductive channel 134 is disposed on the second conductive wire 132, and an upper end surface of the second conductive channel 134 is not covered by the second dielectric layer 130. A material of the third dielectric layer 140 is a third molding compound, and a third conductive wire 142 and a third conductive channel 144 are disposed in the third dielectric layer 140. The third conductive wire 142 is disposed on an upper end surface of the second conductive channel 134, and the third conductive channel 144 is disposed on the third conductive wire 142, and an upper end surface of the third conductive channel 144 is not covered by the third dielectric layer 140. A material of the fourth dielectric layer 150 is a fourth molding compound, and a fourth conductive wire 152, a fourth conductive channel 154 and a circuit device 156 are disposed in the fourth dielectric layer 150. The fourth conductive wire 152 is disposed on an upper end surface of the third conductive channel 154, and the fourth conductive channel 154 and the circuit device 156 are disposed on the fourth conductive wire 152, and an upper end surface of the fourth conductive channel 154 is not covered by the fourth dielectric layer 150.

The first dielectric layer 120, the second dielectric layer 130, the third dielectric layer 140 and the fourth dielectric layer 150 can be manufactured by a molding technology of a packaging gel, for example, a compression molding. The first molding compound, the second molding compound, the third molding compound and the fourth molding compound can be a molding compound of a Novolac-based resin, an epoxy-based resin, or a silicon-based resin. Fillers such as silicon dioxide ($SiO_2$) or aluminum oxide ($Al_2O_3$) can be added to the above-mentioned molding compounds with different contents or weight percentages. Taking the most commonly used epoxy molding compound (EMC) as an example, the main components and their weight percentages are 12-15 wt % epoxy resin, 8-10 wt % Novolac Resin, 70-90 wt % Silica filler. The inorganic powder filler is added to reduce the dielectric constant and dielectric loss coefficient of the packaging material. In particular, in the molding compounds for chip packaging, the filler content is usually as high as 70-90 wt % or more. In this embodiment, the first molding compound, the second molding compound, the third molding compound and the fourth molding compound can be epoxy molding compounds (EMC). However, a filler content in the first molding compound is a first weight percentage, a filler content in the second molding compound is a second weight percentage, a filler content in the third molding compound is a third weight percentage and a filler content in the fourth molding compound is a fourth weight percentage. The first weight percentage, the second weight percentage, the third weight percentage and the fourth weight percentage may be the same as or different from each other, depending on the actual performance requirements of the package substrate.

As shown in FIG. 3, the central area of the first dielectric layer 120 is hollowed out to form a first empty region 128 that penetrates the first dielectric layer 120. The central area of the second dielectric layer 130 is hollowed out to form a second empty region 138 that penetrates the second dielectric layer 130. The central area of the third dielectric layer 140 is hollowed out to form a third empty region 148 that penetrates the third dielectric layer 140. The central area of the fourth dielectric layer 150 is hollowed out to form a fourth empty region 158 that penetrates the fourth dielectric layer 150. In this embodiment, the first empty region 128, the second empty region 138, the third empty region 148 and the fourth empty region 158 overlap each other, and the area of the first empty region 128 is not larger than the area of the second empty region 138. The area of the second empty region 138 is not larger than the area of the third empty region 148, and the area of the third empty region 148 is not larger than the area of the fourth empty region 158. There are no specific area restrictions for the above-mentioned empty regions. In addition, the first dielectric layer 120, the second dielectric layer 130, the third dielectric layer 140 and the fourth dielectric layer 150 can be square, but are not limited thereto, and they may also be circular or other shapes such as rectangles. In this embodiment, the first empty region 128 and the second empty region 138 are removed together under the same conditions, and therefore have the same area; the third empty region 148 and the fourth empty region 158 are also removed together under the same conditions, and therefore have the same area. The third empty region 148 and the fourth empty region 158 can be used for accommodating or setting an image sensing device (not shown), for example, a complementary metal-oxide-semiconductor image sensor (CMOS image sensor, referred to as CIS), and the bump pad is connected to the exposed end of the second conductive channel 134. Therefore, the package substrate 100 of this embodiment can be used to make an image sensing module.

In this embodiment, the circuit device 156 is a passive device, such as a resistor, an inductor, or a capacitor, and can be adhered to the fourth conductive wire 152 by a conductive adhesive 157. As shown in FIG. 3, the circuit device 156 is buried in the fourth dielectric layer 150 and can be well protected by the molding compound. The molding compound of the first dielectric layer 120 can also be used to replace the solder mask used in the conventional printed circuit board to protect the package substrate 100 and improve the reliability of the product. In addition, the first conductive channel 124, the second conductive channel 134, the third conductive channel 144, and the fourth conductive channel 154 can be made into metal pillars, such as copper pillars. The first conductive wire 122, the second conductive wire 132, the third conductive wire 142, and the fourth conductive wire 152 can be made into a fine-pitch wire by a semi-additive process (SAP), its wire width and spacing can reach 20 μm. Furthermore, the first conductive wire 122 can be made into a buried wire, and the wire width and pitch of the buried wire can reach 15 μm.

The method and process for manufacturing the package substrate 100 according to the first embodiment of the invention will be described below. Please refer to FIG. 4A to FIG. 4F and FIG. 3, which are structural cross-sectional views corresponding to each process step of the package substrate 100 according to the first embodiment, respectively.

Figure 4A:
FIG. 4A to FIG. 4F are structural cross-sectional views corresponding to each process step of the package substrate according to the first embodiment.

First, as shown in FIG. 4A, a carrier board 110 is provided. The carrier board 110 is a metal substrate or a dielectric material substrate coated with a metal layer on the surface, and is used to carry or support subsequent processes of the package substrate 100, for example, to make conductive circuits of the package substrate 100. The metal composition of the substrate includes iron (Fe), copper (Cu), nickel (Ni), tin (Sn), aluminum (Al), nickel/gold (Ni/Au), and combinations or alloys thereof, but are not limited thereto.

Figure 4B:
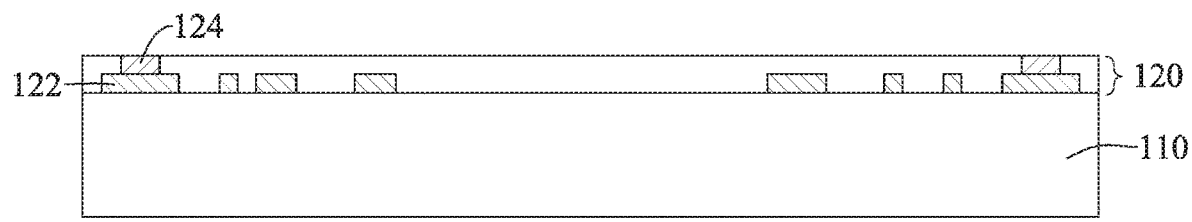

Then, as shown in FIG. 4B, the first conductive wire 122 and the first conductive channel 124 can be fabricated on the carrier board 110 by a build-up process, such as a semi-additive method using electroplating technology. And by using a molding technology, the first molding compound covers the carrier board 110, the first conductive wire 122, and the first conductive channel 124. Then, a part of the first molding compound is removed by a grinding technique, so that the upper end surface of the first conductive channel 124 is exposed, and the fabrication of the first dielectric layer 120 is completed.

Figure 4C:
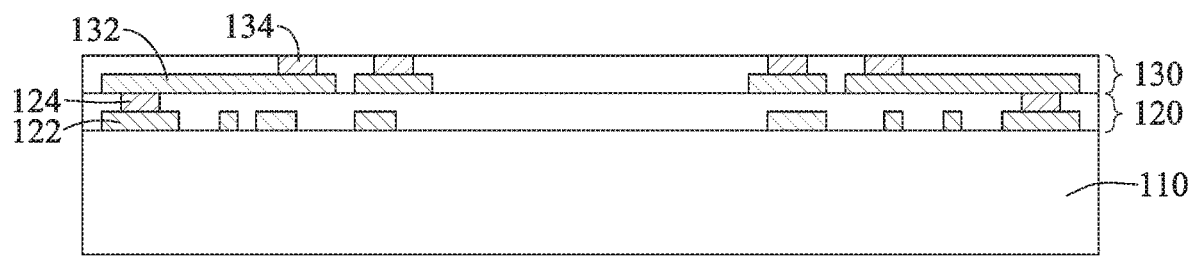

Then, as shown in FIG. 4C, the second conductive wire 132 and the second conductive channel 134 can be fabricated on the first dielectric layer 120 by a build-up process, such as a semi-additive method using electroplating technology. And by using a molding technology, the second molding compound covers the first dielectric layer 120, the second conductive wire 132, and the second conductive channel 134. Then, a part of the second molding compound is removed by a grinding technique, so that the upper end surface of the second conductive channel 134 is exposed, and the fabrication of the second dielectric layer 130 is completed.

Figure 4D:
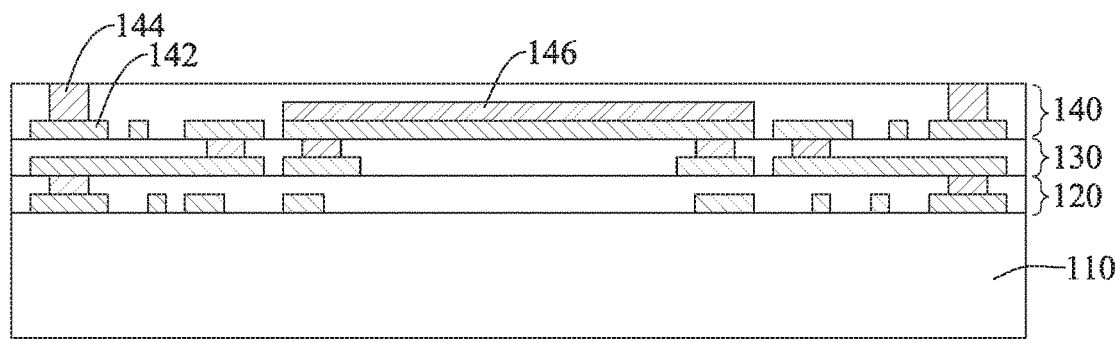

Then, as shown in FIG. 4D, the third conductive wire 142 and the third conductive channel 144 can be fabricated on the second dielectric layer 130 by a build-up process, such as a semi-additive method using electroplating technology. In order to form a third empty region 148 and a fourth empty region 158 in the third dielectric layer 140 and the fourth dielectric layer 150 subsequently (as shown in FIG. 3), a release film 146 is disposed on the third conductive wire 142. And by using a molding technology, the third molding compound covers the second dielectric layer 130, the third conductive wire 142, the third conductive channel 144 and the release film 146. Then, a part of the third molding compound is removed by a grinding technique, so that the upper end surface of the third conductive channel 144 is exposed, and the fabrication of the third dielectric layer 140 is completed.

Figure 4E:
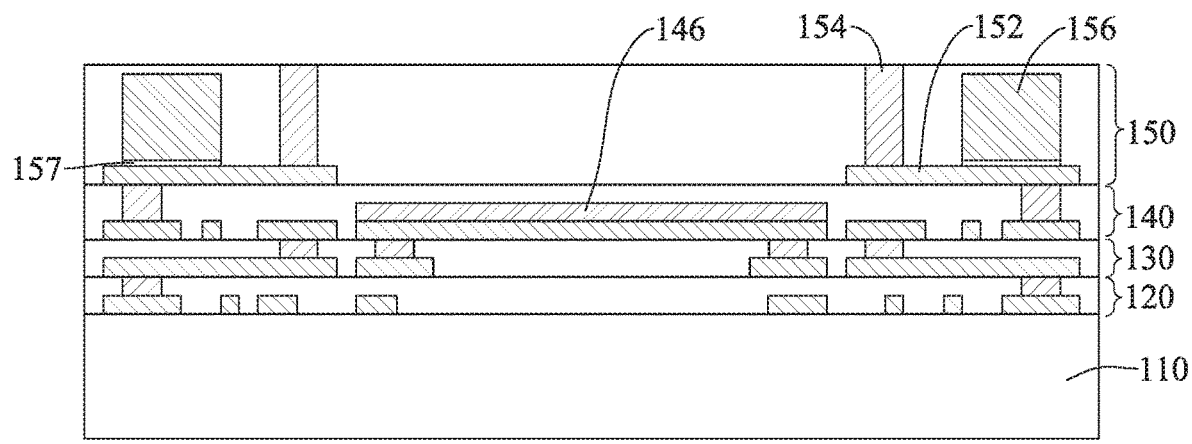

Then, as shown in FIG. 4E, the fourth conductive wire 152 and the fourth conductive channel 154 can be fabricated on the third dielectric layer 140 by a build-up process, such as a semi-additive method using electroplating technology. Then, the circuit device 156 is adhered to the fourth conductive wire 152 by the conductive adhesive 157. And by using a molding technology, the fourth molding compound covers the third dielectric layer 140, the fourth conductive wire 152, the fourth conductive channel 154 and the circuit device 156. Then, a part of the fourth molding compound is removed by a grinding technique, so that the upper end surface of the fourth conductive channel 154 is exposed, and the fabrication of the fourth dielectric layer 150 is completed.

Figure 4F:
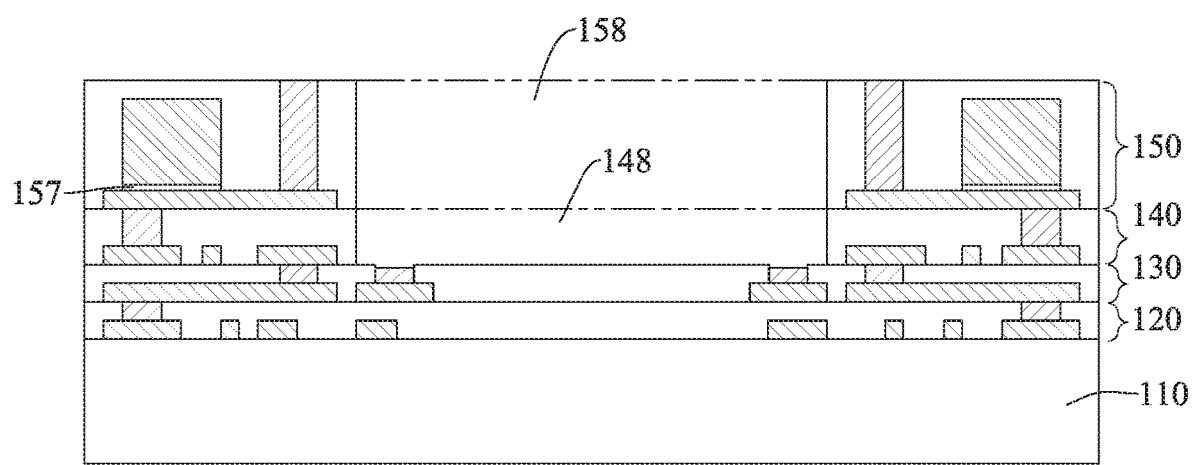

Next, the third dielectric layer 140 and the fourth dielectric layer 150 on the peripheral region of the release film 146 are cut by laser. After removing the release film 146 and a portion of the peripheral region of the third dielectric layer 140 and the fourth dielectric layer 150, the third empty region 148 and the fourth empty region 158 are formed, as shown in FIG. 4F. Then, a portion of the third conductive wire 142 is removed by an etching technique, and during this process, the upper end surface of the portion of the second conductive channel 134 is also slightly drawn.

Next, the carrier board 110 is removed, and a portion of the first dielectric layer 120 and the second dielectric layer 130 are removed by laser cutting technology to form the first empty region 128 and the second empty region 138. The first empty region 128 and the second empty region 138 penetrate the first dielectric layer 120 and the second dielectric layer 130 respectively, and the package substrate 100 shown in FIG. 3 can be obtained.

Figure 5:
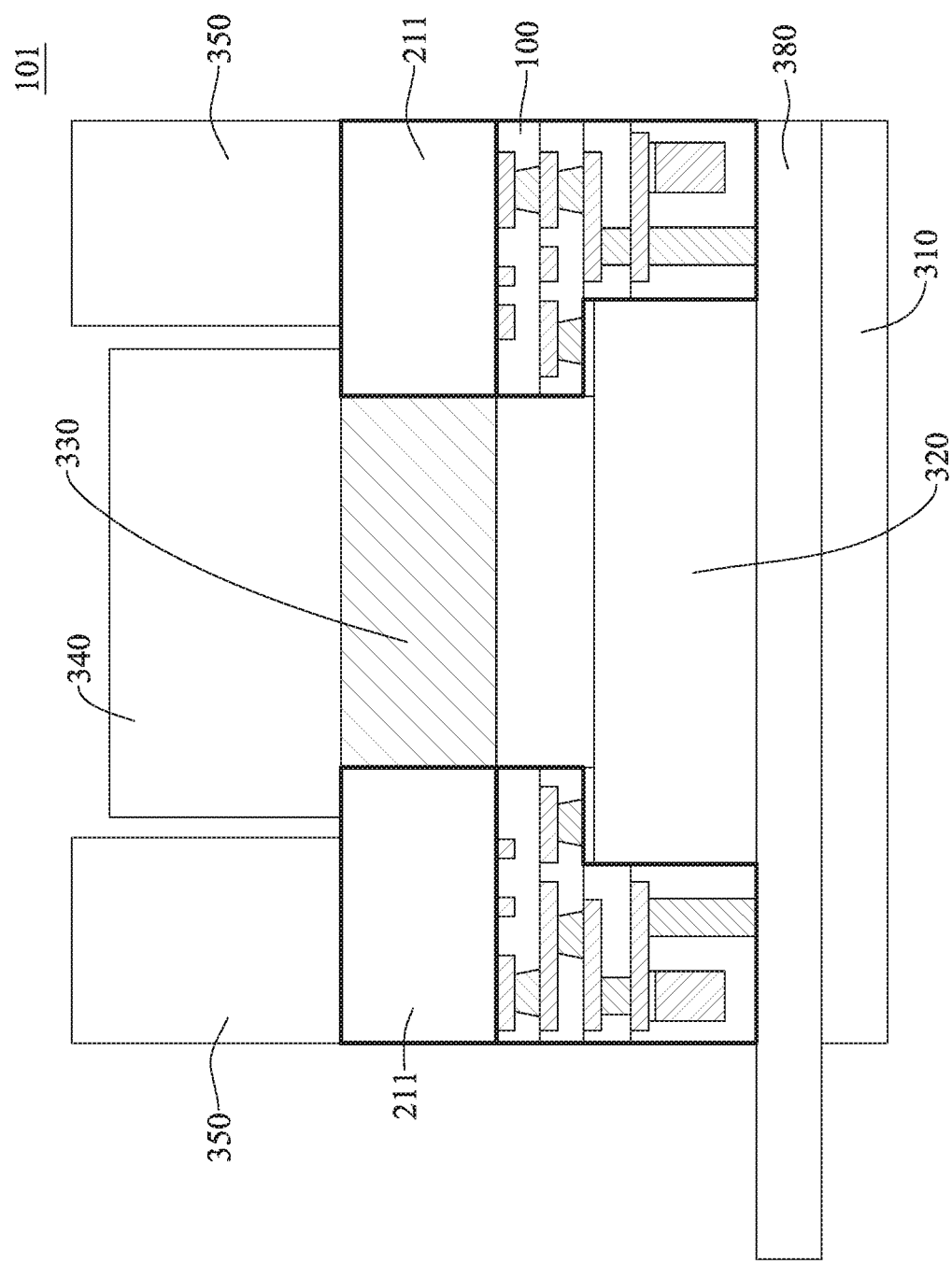
FIG. 5 is a cross-sectional view of a camera lens module according to a second embodiment.

FIG. 5 is a schematic cross-sectional view of a camera lens module 101 according to a second embodiment of the present invention. The camera lens module 101 is constructed on the basis of the package substrate 100 of the first embodiment, wherein only the central region of the carrier board 110 is removed, and the remaining part is used as a support holder 211 of the camera lens module 101. The camera lens module 101 includes an image sensing device 320 connected to the third empty region 148 and the fourth empty region 158 with flip-chip. The camera lens module 101 further includes a filter glass sheet 330 disposed on the hollow area of the support holder 211, a lens group 340 disposed on the filter glass sheet 330, and a voice coil motor 350 disposed on the support holder 211. In addition, a surface of the fourth dielectric layer 150 may be pasted with a flexible circuit board 380, and the flexible circuit board 380 is electrically connected to the one end surface of the fourth conductive channel 154 exposed on the surface of the fourth dielectric layer 150. Then, a metal heat sink (such as the heat sink 310) is adhered to the surface of the flexible circuit board 380 to improve the heat dissipation capability of the image sensing device 320.

The advantages of this embodiment are as follows. (1) The camera lens module 101 can meet the needs of a substrate that integrates a rigid-flex board, an embedded image sensing chip, and an embedded circuit device, which can simplify the module assembly process and improve the assembly yield. (2) The bottom surface of the flexible circuit board 380 directly adheres to the heat sink 310, and good flatness can enhance heat dissipation ability. (3) Semi-Additive Process (SAP) can be used to achieve fine wire fabrication from 20/20 microns to 15/15 microns. (4) The alignment technology of image transfer is adopted, and the alignment accuracy between layers is high.

Figure 6A:
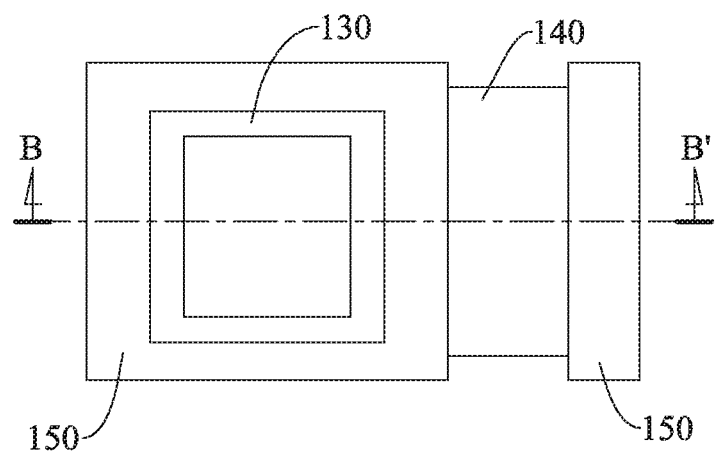
FIGS. 6A and 6B are a top plan view and a bottom plan view of a package substrate according to a third embodiment, respectively.
Figure 6B:
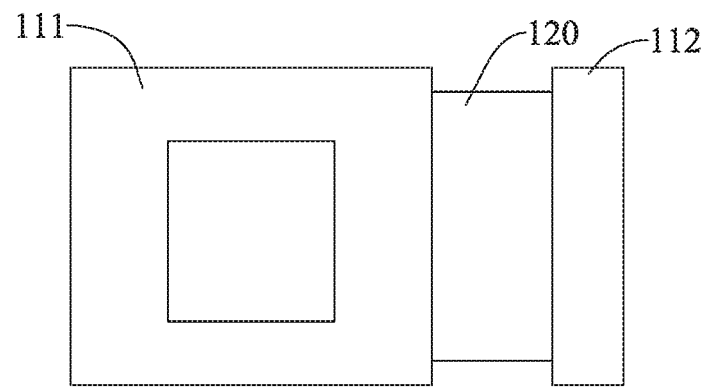
Figure 7:
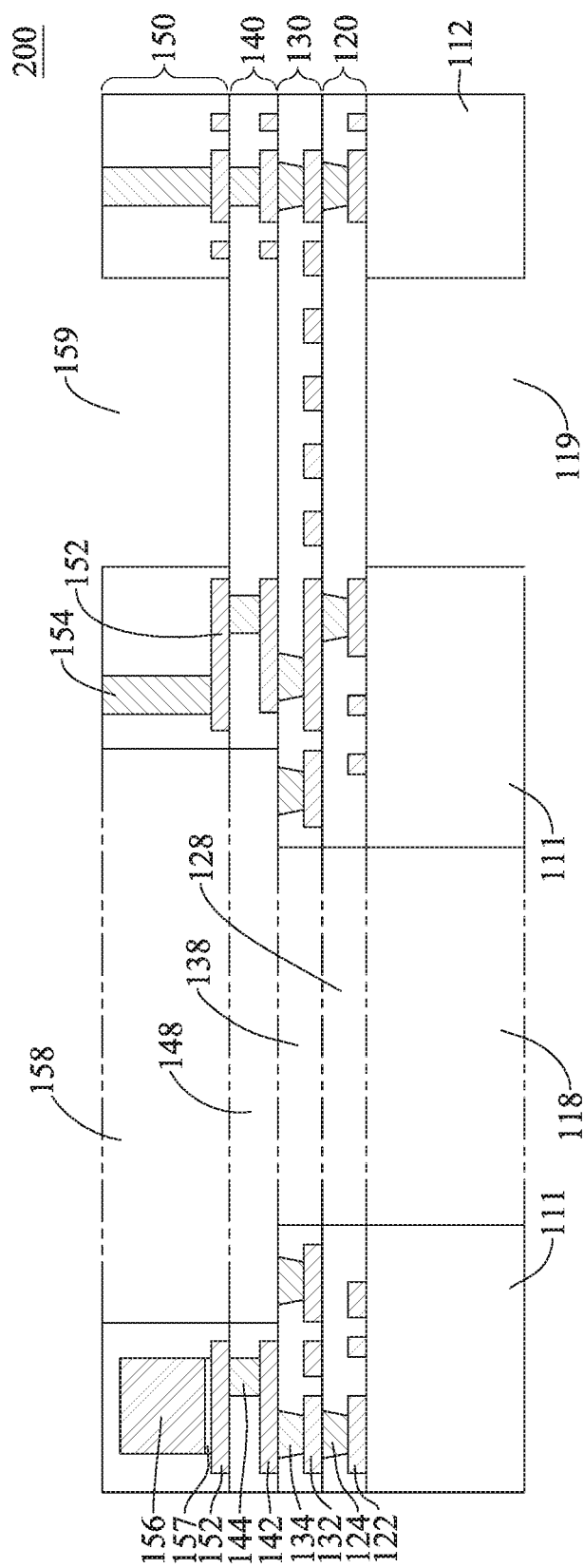
FIG. 7 is an enlarged cross-sectional view taken along a straight line BB' of FIG. 6A of the package substrate according to a third embodiment.

Furthermore, FIGS. 6A and 6B are a top plan view and a bottom plan view of a package substrate 200 according to a third embodiment of the present invention, respectively. FIG. 7 is an enlarged cross-sectional view taken along a straight line BB'. The package substrate 200 is quite similar to the package substrate 100 of the first embodiment. Only the differences will be described below, and the same points will not be described again. The carrier board of the package substrate 200 is provided with a disconnecting region 119 which is cut into two parts, namely a first substrate 111 on the left and a second substrate 112 on the right. The first substrate 111 has a central empty region 118 penetrating the first substrate 111, and the first dielectric layer 120 is disposed on the first substrate 111 and the second substrate 112.

In this embodiment, the first molding compound, the second molding compound and the third molding compound can be flexible molding compounds. The first dielectric layer 120, the second dielectric layer 130 and the third dielectric layer 140 are formed into a flexible multilayer structure, and extend between the first substrate 111 and the second substrate 112. So that the disconnecting region 119 between the first substrate 111 and the second substrate 112 can be bent and deformed to become a flexible board structure. That is, the package substrate 200 will be a Rigid-Flex substrate structure. As shown in FIG. 6A, FIG. 6B, and FIG. 7, the first substrate 111 has a central empty region 118. The central empty region 118, the first empty region 128, the second empty region 138, the third empty region 148 and the fourth empty region 158 overlap each other. And, in this embodiment, the area of the central empty region 118 is not larger than the area of the first empty region 128. The area of the first empty region 128 is not larger than the area of the second empty region 138. The area of the second empty region 138 is not larger than the area of the third empty region 148, and the area of the third empty region 148 is not larger than the area of the fourth empty region 158. There are no specific area restrictions for the above-mentioned empty regions. The third empty region 148 and the fourth empty region 158 can be used for accommodating or setting an image sensing device (not shown), for example, a complementary metal-oxide-semiconductor image sensor (CIS), and the bump pad is connected to the exposed end of the second conductive channel 134. Therefore, the package substrate 200 of this embodiment can be used to make an image sensing module.

In this embodiment, the fourth molding compound is a hard molding compound, so that the circuit element 156 is buried in the fourth dielectric layer 150 and can be well protected by the hard molding compound. In addition, the fourth dielectric layer 150 is provided with a disconnection groove 159 for cutting off the fourth dielectric layer 150 corresponding to the disconnecting region 119 of the substrate. The first substrate 111 and the second substrate 112 can strengthen the structural strength of the package substrate 200 and serve as an outer layer protection of the package substrate 200. When the package substrate 200 is applied to a digital camera or a video camera of a mobile device, the first substrate 111 and the second substrate 112 can support the entire image sensing module, thereby improving product reliability. Because of such a structural design, the circuit element 156, the first substrate 111, and the second substrate 112 are integrated into a package substrate, the product assembly process can be greatly simplified, and the product assembly yield is improved. Moreover, the first conductive channel 124 (the second conductive channel 134) is manufactured by first covering the first conductive wire 122 (the second conductive wire 132) with a molding compound, and then forming a blind hole in the first dielectric layer 120 (the second dielectric layer 130) by using laser drilling technology, and using electroplating or other technology to fill the blind hole with conductive material. The third conductive channel 144 and the fourth conductive channel 154 can be made into metal pillars.

Figure 8:
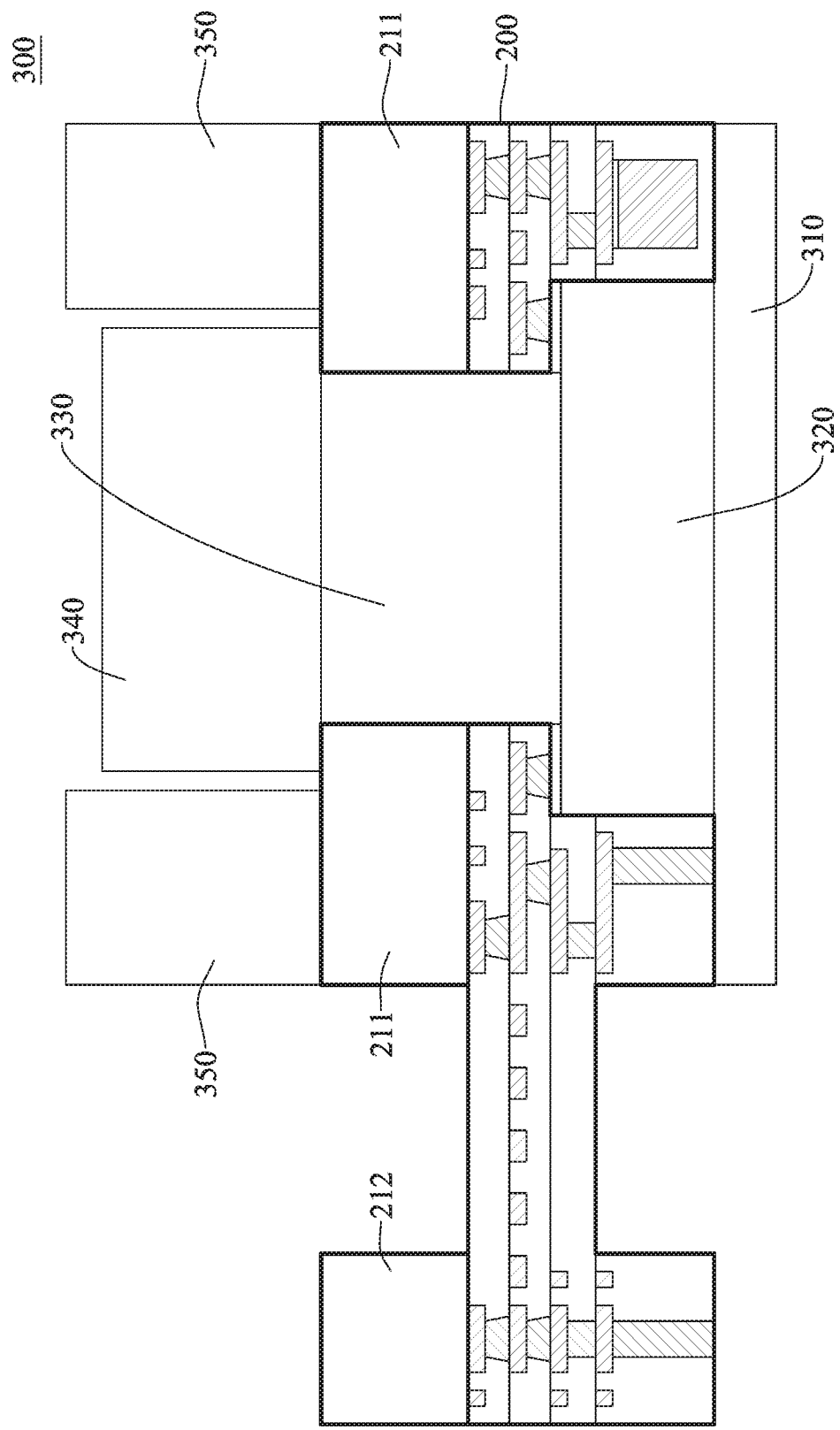
FIG. 8 is a schematic cross-sectional view of a camera lens module according to a fourth embodiment.

FIG. 8 is a schematic cross-sectional view of a camera lens module 300 according to a fourth embodiment of the present invention. The camera lens module 300 is constructed on the basis of the package substrate 200 of the third embodiment, wherein the first substrate 111 and the second substrate 112 serve as a support holder 211 and a reinforcement plate 212 of the camera lens module 300, respectively. That is, the first substrate 111 and the second substrate 112 formed by the carrier board 110 that have not been completely removed can be used as the support holder 211 and the reinforcement plate 212. In this embodiment, the package substrate 200 is a rigid-flex board, and both the hard board and flexible board are epoxy-based materials, rather than the combination of a hard substrate and a flexible circuit board of the conventional technology. Therefore, the problem of poor bonding between the hard substrate and the flexible circuit board can be effectively solved.

Please refer to FIG. 7 and FIG. 8 at the same time, the camera lens module 300 includes the image sensing device 320 disposed in the third empty region 148 and the fourth empty region 158. The camera lens module 300 further includes a filter glass sheet 330 disposed in the central empty region 118, the first empty region 128 and the second empty region 138. The heat sink 310 disposed under the image sensing device 320. The lens group 340 disposed on the filter glass sheet 330, and the voice coil motor 350 disposed on the support holder 211. The heat sink 310 can be directly adhered to the bottom of the image sensing device 320 to improve the heat dissipation capability of the image sensing device 320. Therefore, the support holder 211 (or the first substrate 111) and the reinforcement plate 212 (or the second substrate 112) are integrally formed and integrated in the package substrate 200, which can greatly simplify the product assembly process and improve the product assembly yield.

The advantages of this embodiment are as follows. (1) The camera lens module 300 can meet the needs of a substrate that integrates a rigid-flex board, an embedded image sensing chip, and an embedded circuit device, which can simplify the module assembly process and improve the assembly yield. (2) The bottom surface of the flexible circuit board 320 directly adheres to the heat sink 310, and good flatness can enhance heat dissipation ability. (3) Semi-Additive Process (SAP) can be used to achieve fine wire fabrication from 20/20 microns to 15/15 microns. (4) The alignment technology of image transfer is adopted, and the alignment accuracy between layers is high.

The above is intended to be illustrative only and not limiting. Any other equivalent modifications or alterations of the present invention are intended to be included in the scope of the appended claims.

What is claimed is:

1. A package substrate, comprising:
   a first dielectric layer, formed of a first molding compound, and the first dielectric layer having a first empty region penetrating through the first dielectric layer;
   a first conductive wire and a first conductive channel, disposed in the first dielectric layer, wherein the first conductive channel is disposed on the first conductive wire, and one end surface of the first conductive channel is exposed on the first dielectric layer;
   a second dielectric layer, disposed on the first dielectric layer, formed of a second molding compound, and the second dielectric layer having a second empty region corresponding to the first empty region and penetrating through the second dielectric layer;
   a second conductive wire and a second conductive channel, disposed in the second dielectric layer, wherein the second conductive wire is electrically connected to the first conductive channel, the second conductive channel is disposed on the second conductive wire, and one end surface of the second conductive channel is exposed on the second dielectric layer;
   a third dielectric layer, disposed on the second dielectric layer, formed of a third molding compound, and the third dielectric layer having a third empty region corresponding to the second empty region and penetrating through the third dielectric layer;
   a third conductive wire and a third conductive channel, disposed in the third dielectric layer, wherein the third conductive wire is electrically connected to the second conductive channel, the third conductive channel is disposed on the third conductive wire, and one end surface of the third conductive channel is exposed on the third dielectric layer;
   a fourth dielectric layer, disposed on the third dielectric layer, formed of a fourth molding compound, and the fourth dielectric layer having a fourth empty region corresponding to the third empty region and penetrating through the fourth dielectric layer; and
   a fourth conductive wire, a fourth conductive channel and a circuit device, disposed in the fourth dielectric layer, wherein the fourth conductive wire is electrically connected to the third conductive channel, the fourth conductive channel and the circuit device are disposed on the fourth conductive wire, and one end surface of the fourth conductive channel is exposed on the fourth dielectric layer;
   wherein the first empty region, the second empty region, the third empty region and the fourth empty region integratedly form a channel which is completely penetrating through the first dielectric layer, the second dielectric layer, third dielectric layer and the fourth dielectric layer;
   wherein the area of the first empty region is not larger than the area of the second empty region, and the area of the second empty region is not larger than the area of the third empty region, and the area of the third empty region is not larger than the area of the fourth empty region.

2. The package substrate as recited in claim 1, wherein the third empty region and the fourth empty region are used to accommodate an image sensing device.

3. The package substrate as recited in claim 2, further comprising a flexible circuit board disposed on the image sensing device and the fourth dielectric layer, and the flexible circuit board electrically connected to the one end surface of the fourth conductive channel exposed on the fourth dielectric layer.

4. The package substrate as recited in claim 3, further comprising a metal heat sink disposed on the flexible circuit board.

5. The package substrate as recited in claim 1, wherein the circuit device is adhered to the fourth conductive wire by a conductive adhesive.

6. The package substrate as recited in claim 1, wherein the first molding compound, the second molding compound, the third molding compound, and the fourth molding compound are epoxy molding compounds.

7. A package substrate, comprising:
- a carrier board, having a central empty region penetrating through the carrier board and a disconnecting region cutting off the carrier board;
- a first dielectric layer, a second dielectric layer, a third dielectric layer and a fourth dielectric layer, formed of a first molding compound, a second molding compound, a third molding compound, and a fourth molding compound, respectively, wherein the first dielectric layer is disposed on the carrier board, the second dielectric layer is disposed on the first dielectric layer, the third dielectric layer is disposed on the second dielectric layer, and the fourth dielectric layer is disposed on the third dielectric layer; wherein the first dielectric layer, the second dielectric layer, and the third dielectric layer are flexible molding compounds, and the fourth dielectric layer are hard molding compounds;
- wherein the first dielectric layer, the second dielectric layer, and the third dielectric layer are flexible with respect to the disconnecting region of the carrier board;
- wherein the first dielectric layer, the second dielectric layer, the third dielectric layer, and the fourth dielectric layer correspond to the central of the carrier board, and a first empty region, a second empty region, a third empty region and a fourth empty region are respectively correspondingly provided;
- wherein the central empty region, the first empty region, the second empty region, the third empty region and the fourth empty region integratedly form a channel which is completely penetrating through the carrier board, first dielectric layer, the second dielectric layer, third dielectric layer and the fourth dielectric layer;
- wherein the area of the central empty region is not larger than the area of the first empty region, and the area of the first empty region is not larger than the area of the second empty region, and the area of the second empty region is not larger than the area of the third empty region, and the area of the third empty region is not larger than the area of the fourth empty region;
- wherein a portion of the fourth dielectric layer corresponding to the disconnecting region of the carrier board is provided with a disconnection groove cutting off the fourth dielectric layer;
- a first conductive wire and a first conductive channel, disposed in the first dielectric layer, wherein the first conductive channel is disposed on the first conductive wire, and one end surface of the first conductive channel is exposed on the first dielectric layer;
- a second conductive wire and a second conductive channel, disposed in the second dielectric layer, wherein the second conductive wire is electrically connected to the first conductive channel, the second conductive channel is disposed on the second conductive wire, and one end surface of the second conductive channel is exposed on the second dielectric layer;
- a third conductive wire and a third conductive channel, disposed in the third dielectric layer, wherein the third conductive wire is electrically connected to the second conductive channel, the third conductive channel is disposed on the third conductive wire, and one end surface of the third conductive channel is exposed on the third dielectric layer; and
- a fourth conductive wire, a fourth conductive channel and a circuit device, disposed in the fourth dielectric layer, wherein the fourth conductive wire is electrically connected to the third conductive channel, the fourth conductive channel and the circuit device are disposed on the fourth conductive wire, and one end surface of the fourth conductive channel is exposed on the fourth dielectric layer.

8. The package substrate as recited in claim 7, wherein the third empty region and the fourth empty region are used to accommodate an image sensing device.

9. The package substrate as recited in claim 7, further comprising a metal heat sink disposed on the fourth dielectric layer.

10. The package substrate as recited in claim 7, wherein the circuit device is adhered to the fourth conductive wire by a conductive adhesive.

11. The package substrate as recited in claim 7, wherein the first molding compound, the second molding compound, the third molding compound, and the fourth molding compound are epoxy molding compounds.

* * * * *